(12) United States Patent  
Nakahira et al.

(10) Patent No.: US 7,903,867 B2  
(45) Date of Patent: Mar. 8, 2011

(54) METHOD AND APPARATUS FOR DISPLAYING DETECTED DEFECTS

(75) Inventors: Kenji Nakahira, Fujisawa (JP); Toshifumi Honda, Yokohama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 908 days.

(21) Appl. No.: 11/677,669

(22) Filed: Feb. 22, 2007

(65) Prior Publication Data

US 2007/0194231 A1 Aug. 23, 2007

(30) Foreign Application Priority Data

Feb. 22, 2006 (JP) ................................ 2006-044645

(51) Int. Cl.
*G06K 9/00* (2006.01)
(52) U.S. Cl. ..................................... 382/149; 356/237.3
(58) Field of Classification Search .................... 702/35; 356/237.1; 382/149
See application file for complete search history.

(56) References Cited

U.S. PATENT DOCUMENTS

| | | | | |
|---|---|---|---|---|
| 6,388,747 B2 * | 5/2002 | Nara et al. | ..................... | 356/394 |
| 6,421,122 B2 * | 7/2002 | Nara et al. | ..................... | 356/394 |
| 6,476,913 B1 * | 11/2002 | Machida et al. | ............... | 356/394 |
| 6,553,323 B1 * | 4/2003 | Obara et al. | ..................... | 702/35 |
| 7,602,962 B2 * | 10/2009 | Miyamoto et al. | ............. | 382/149 |
| 2002/0027653 A1 * | 3/2002 | Shibata et al. | ............. | 356/237.3 |
| 2003/0002580 A1 * | 1/2003 | Miura et al. | ............. | 375/240.02 |
| 2004/0188609 A1 * | 9/2004 | Miyai et al. | ................... | 250/310 |
| 2004/0218806 A1 * | 11/2004 | Miyamoto et al. | ............ | 382/145 |
| 2005/0199808 A1 | 9/2005 | Obara et al. | | |
| 2006/0111879 A1 * | 5/2006 | Funakoshi | ....................... | 703/1 |

FOREIGN PATENT DOCUMENTS

| | | |
|---|---|---|
| JP | 2001-015055 | 1/2001 |
| JP | 2005-259396 | 9/2005 |

* cited by examiner

*Primary Examiner* — Nikita Wells  
*Assistant Examiner* — Johnnie L Smith  
(74) *Attorney, Agent, or Firm* — Antonelli, Terry, Stout & Kraus, LLP.

(57) ABSTRACT

Defect image display screens are capable of accurately presenting features of defects. On a thumbnail display screen of a defect, images likely to most clearly indicating features of the defect are determined in units of the defect from, for example, inspection information and a defect type, and then are displayed. On a detail display screen of a defect, for example, images for being displayed so as to clearly indicate features of the defect, and the display sequence thereof are determined in accordance with, for example, inspection information and a defect type, and then are displayed. Further, steps for acquiring a display image during or after defect image acquisition by using, for example, a different defect image acquisition apparatus and a different imaging condition in accordance with preliminarily specified rules are added to an imaging sequence (procedure).

8 Claims, 11 Drawing Sheets

FIG.4

| | | | |
|---|---|---|---|
| ID: | 0001 | ID: | 0002 |
| IMAGE: | LOW MAGNIFICATION A IMAGE / HIGH MAGNIFICATION A IMAGE | IMAGE: | OPTICAL MICROSCOPE IMAGE |
| IMAGE TYPE: | | IMAGE TYPE: | |
| LOW MAGNIFICATION SEM DETECTION: | ○ | LOW MAGNIFICATION SEM DETECTION: | × |
| HIGH MAGNIFICATION SEM DETECTION: | × | HIGH MAGNIFICATION SEM DETECTION: | — |
| ID: | 0003 | ID: | 0004 |
| IMAGE: | LOW MAGNIFICATION A IMAGE / HIGH MAGNIFICATION A IMAGE | IMAGE: | HIGH MAGNIFICATION B IMAGE / EDX |
| IMAGE TYPE: | | IMAGE TYPE: | |
| LOW MAGNIFICATION SEM DETECTION: | ○ | LOW MAGNIFICATION SEM DETECTION: | ○ |
| HIGH MAGNIFICATION SEM DETECTION: | ○ | HIGH MAGNIFICATION SEM DETECTION: | ○ |

...

METHOD AND APPARATUS FOR DISPLAYING DETECTED DEFECTS

BACKGROUND OF THE INVENTION

The present invention relates to a sample examination method using a scanning electron microscope ("SEM," hereafter) that irradiates an electron beam on a pattern formed on a semiconductor wafer in-line in semiconductor front-end processes during the manufacture and that detects electron occurring from an irradiated position. More specifically, the invention relates to a defect display method used with the review SEM for view of in greater detail a defect detected on a semiconductor wafer.

In a current semiconductor production process, defect review is carried out for cause investigation of a defect occurred on a semiconductor wafer in-line of the manufacture. Conventionally, optical microscopes have been used for, for example, defect detection and view purposes. However, in recent years, with semiconductor patterns being smaller, countermeasures have become necessary to address defects of several tens of nanometers in size, such that SEM methods for defect detection and reviewing have been prevailing.

According to an review SEM, such as described above, for review of a defect of the semiconductor, a targeted substrate (sample) is moved toward defect coordinates output from a defect detector, and then the defect is imaged at a high magnification factor ("high magnification," hereinafter). However, the accuracy of the defect coordinates output by the defect detector is low with respect to the field of view of a high magnification image. As such, first, a defective image is acquired imaged at a low magnification factor ("low magnification," hereinafter), and then is acquired at high magnification.

In addition, depending on the case, in, for example, defect review for bare wafers, the accuracy of the defect coordinates output by the defect detector is low with respect to the field of view of a low magnification image. In this case, for example, the accuracy of a defect position is improved by imaging the defect by using an optical microscope appended to the review SEM. Then, the defect position is identified by imaging the defect at a low magnification factor, and then finally, the defect is imaged at a high magnification factor at the defect position.

In acquiring images at the low and high magnification factors by using the review SEM, a plurality of detectors are used. Thereby, a plurality of images indicative of different features of a sample are created. In addition, depending on the system, the configuration includes an EDX (energy dispersion X-ray spectrum) function. The EDX function irradiates an electron beam onto a sample, detects an X-ray emitted from a neighboring portion of a defective portion, and thereby calculates an energy distribution of the X-ray, whereby to examine the composition of the defect.

It is necessary to take countermeasures by analyzing the cause of defect occurrence after defect imaging. Normally, the review SEM includes an automatic defect classifying function as a support function for cause analysis for defects. The automatic defect classifying function acquires feature values of an SEM image, such as defect sizes, shapes, and textures, as detail information from a high magnification defect image. Then, the function classifies the types of defects in accordance with the detail information.

In many cases, other support functions for analyzing the causes of defect occurrences include a defect image display function that displays acquired defect images or outputs (prints) onto a paper sheet. The defect image display function includes, for example, a thumbnail display screen and a detail display screen. The thumbnail display screen displays, for example, thumbnail images, thereby to display many defects on one screen. The detail display screen displays, for example, many images and signals of respective defects. Such the defect image display function is also capable of display defects corresponding to respective defect types classified by, for example, the automatic defect classifying function.

As a method of acquiring an image taken of a sample as diagonally viewed through an SEM, Japanese Unexamined Patent Application Publication No. 2001-15055 discloses a method for acquiring an image by setting the incidence direction of electron beam being irradiating onto a sample to a diagonal direction with respect to the surface of the sample.

SUMMARY OF THE INVENTION

However, according to the conventional defect image display function described above, the types of, for example, display images and signals and display sequences of the images, for example, are fixed across all types of defects. This poses problems as described herebelow.

For example, for defect position identification to be carried out by, for example, the SEM at low magnification or by the optical microscope after the imaging operation, cases can occur in which defect detection cannot be accomplished as in the cases of, for example, erroneous detection in the defect detector and a defect that cannot be reviewed through the SEM. In such cases, the defect position cannot be identified. According to the conventional defect image display function, the thumbnail image screen does not display any images of detects for which defect position identification has failed. In addition, even on the detail display screen, nothing is displayed in a display screen provided to display high magnification images, such that features of the defect cannot easily be obtained.

Further, defects can occur below a thin film of the surface. In this case, of a plurality of images acquired from a plurality of detectors by using the SEM, in images generated from a detector for primarily collecting secondary electrons, the presence or absence of a defect cannot be readily verified. Rather, the presence or absence of a defect generated from a detector from backscattered electrons containing much irregularity information can be readily verified since the contract of a portion of the defect becomes high. Thus, depending on the case, the types of images clearly indicating defect features are different from one another, and defects cannot be readily visually verified in other types of images. As such, in the defect image display function of the conventional review SEM, a user has to seek for an image clearly disclosing the defect feature in units of a defect.

Further, cases can occur in which, for example, since a defect cannot be detected from a low magnification image acquired by the SEM, it is better to acquire an image of the optical microscope to be a display image, or alternatively, it is better to re-image a once acquired SEM image by using the SEM to be a display image. Thus, there are cases in which a defect cannot be detected and in which when a defect is imaged at high magnification but not to satisfaction, an image satisfactorily showing a feature of the defect can be obtained by alteration of an imaging condition. This is already known as an obvious fact, but the convention review SEM does not have a function that later acquires images for use in the defect image display function.

In view of the above-described, the present invention is aimed to provide a method of altering, for example, the type of a display image and a display sequence thereof in a review SEM. Further, the invention is aimed to provide an imaging sequence (procedure) for acquiring a display image by necessity.

The present invention provides a method for displaying defect images by performing imaging processing of defects occurred on a sample. In the method, a plurality of images (or, "per-defect images," hereinbelow) of respective ones of a plurality of defects are acquired by performing imaging processing under respective ones of a plurality of conditions in accordance with position information of the respective ones of the plurality of defects detected on a sample by inspection preliminarily performed using an inspection apparatus. Images for being displayed corresponding to the respective defects from the plurality of per-defect images acquired on the plurality of defects are extracted; and then, the extracted per-defect images in a side-by-side arrangement on a screen together with information of types of the respective images.

Further, the present invention provides a defect review apparatus including optical image acquisition means that acquires a plurality of optical images by performing optical imaging processing of a sample in accordance with position information of respective ones of plurality of defects detected on the sample by inspection preliminarily performed using an inspection apparatus; SEM image acquisition means that acquires a plurality of SEM images of a sample in accordance with either position information of respective ones of plurality of defects detected on the sample by inspection preliminarily performed using an inspection apparatus or the position information of the respective ones of the plurality of defects detected on the sample by inspection preliminarily performed using the inspection apparatus; image processing means that processes the optical images acquired by the optical image acquisition means and the SEM images acquired by the SEM image acquisition means; and display means including a display screen that displays the images processed by the image processing means. The image processing means extracts images for being displayed on the display screen of the display means in correspondence to the respective ones of the plurality of defects from among the plurality of optical images of the plurality of defects on the sample, which optical images have been acquired by the optical image acquisition means, and the plurality of SEM images of the plurality of defects on the sample, which SEM images have been acquired by the SEM image acquisition means. The display means displays the extracted images corresponding to the respective defects in a side-by-side arrangement on display screen together with information of types of the respective images.

Consequently, according to the present invention, a display method can be provided in which, in the event that defects have occurred in semiconductor wafer manufacturing steps, a user is able to easily and quickly verify features of the defects.

These and other objects, features and advantages of the invention will be apparent from the following more particular description of preferred embodiments of the invention, as illustrated in the accompanying drawings.

BRIEF DESCRIPTION OF THE DRAWINGS

In the accompanying drawings:

FIG. 4 shows one embodiment of a thumbnail display screen of defect images;

DESCRIPTION OF THE PREFERRED EMBODIMENTS

Embodiments according to the present invention will be described hereinbelow with reference to the accompanying drawings. With semiconductor patterns becoming smaller, SEMs (scanning electron microscopes) capable of performing imaging at higher magnifications than optical microscopes are used as microscopes for inspection of defects. Of such SEMs, review SEMs have a primary functionality in which, in a defect position detected by a defect detector, an SEM images and displays a defect(s).

Figure 1:
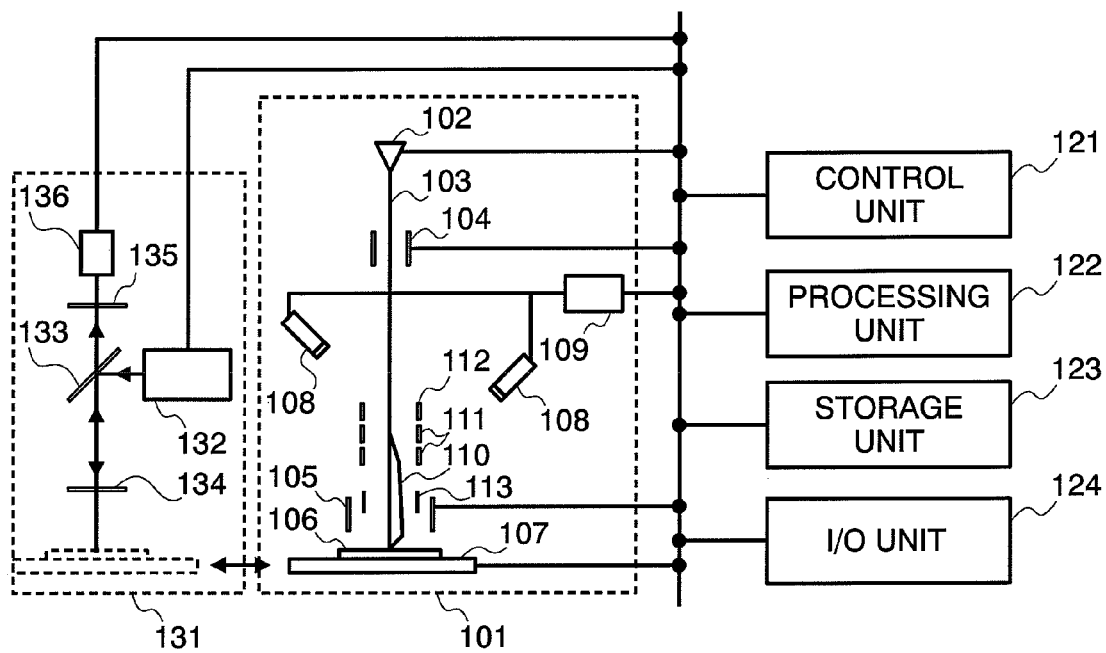
FIG. 1 shows a basic construction of a review SEM in accordance with one embodiment of the present invention.

FIG. 1 shows a basic construction of a review SEM in accordance with one embodiment of the present invention. The review SEM includes, for example, a SEM 101, a control unit 121, a processing unit 122, a storage unit 123, and an input/output 124 (I/O unit). Depending on the case, the review SEM further includes an optical microscope 131 that uses one or both of a brightfield and a darkfield. Further, the review SEM can include, for example, an electron optical system (not shown) for irradiating an electron beam 110 on a sample from a diagonal direction setoff from the vertical direction, and a device (not shown) for implementing EDX analysis that detects an X-ray emitted from a neighboring portion of a defective portion, and thereby calculates an energy distribution of the X-ray, whereby to examine the composition of the defect.

In acquisition of an SEM image, a primary electron beam 103 is generated from an electron gun 102, is passed through a focus lens 104, is deflected by a deflection unit 111, and is passed through an objective lens 105. Thereby, the electron beam is focused and irradiated onto a sample 106. In this event, secondary charged particles, such as secondary electrons and backscattered electrons occurred from the sample 106, are detected from a detector 108, and are converted by a digital converter 109 to data signals. Then, an image is generated and processed by the processing unit 122 by using the data signals, and is stored into the storage unit 123. Imaging processing as described above can be performed in an arbitrary position of a wafer by moving a stage 107.

Ordinarily, the review SEM includes a plurality of detectors 108. For the detector 108, a secondary electron detector or backscattered electron detector, for example, is used. The secondary electron detector is designed to detect a large quantity of secondary electrons in the manner that a positive bias voltage is applied to, for example, detection portions of the detector and neighboring portions thereof. The backscattered electron detector is designed to detect a large quantity of backscattered electrons in the manner that either voltage is not applied to detection portions of the detector or neighboring portions thereof, or a negative bias voltage is applied thereto. The secondary electron detector enables acquirement of images with high contrast and S/N (signal to noise) ratio on an edge portion of the sample 106. The backscattered electron detector enables acquirement of images with high contrast on gentle irregularity of the sample 106.

Information of a lateral surface of the sample 106 can be obtained through imaging processing performed in the manner that electrons are applied to the sample 106 from the diagonal direction as in the case of the electron beam 110. A method for electron beam irradiation from the diagonal direction is described in, for example, the above-referenced patent document. The document describes that an electron beam (110) is inclined by use of a deflection unit (111) for deflecting the electron beam (110) apart from an optical axis, and a correction unit (112) for substantially correcting color dispersion on the plane of the sample 106 surface by dispersing the electron beam (110). Alternatively to the method such as described above, another method can be employed. For example, a method using a plurality of electron beam columns, a method inclining the electron beam column, or a method inclining the stage 107 can be employed to thereby irradiate the electron beam 110 onto the sample 106 from the diagonal direction, whereby making it possible to implement the image process.

In addition, an image with a feature different from that in the case of, for example, using the different detectors or the case of electron beam irradiation from the diagonal direction can be acquired by altering the imaging condition. For example, the difference between the potentials of the sample 106 and the primary electron beam 103 is reduced to reduce the energy of electrons being irradiated onto the sample 106. Thereby, the influence of shading attributed to a contrast variation occurring by charging of the sample 106 can be reduced. Conversely, the resolution can be improved by increasing the energy of electrons being irradiated onto the sample 106, whereby EDX data can be acquired. Another example method is such that, in the event of review of a pit-shaped defect, a positive bias voltage of, for example, several kilovolts, is applied to an electrode 113 to enable detection of a large quantity of electrons emitted from a pit bottom. Conversely, the bias voltage is not applied to the electrode 113, whereby an image with increased potential contrast can be acquired.

Imaging processing using the optical microscope 131 is carried out to acquire an image of the sample 106 in the following manner. For example, light emanated from an light source 132 is irradiated onto the sample 106 through a beam splitter 133 and an objective lens 134, and the irradiated light is reflected off and scattered from the sample 106 is focused by an imaging lens through the beam splitter 133, and then is imaged by an image sensor 136.

Processes, such as defect detection from an image and calculation of an image type, are carried out by the processing unit 122, and defect information, such as inspection information and defect type, are stored into the storage unit 123. Inputting of an electron optical system condition for imaging processing and outputting of the acquired image are carried out through the I/O unit 124. The control unit 121 controls, for example, voltage applied in the peripheral portion of the electron gun 102, predetermined position adjustment of the focus lens 104 and the objective lens 105, movement of the stage 107, and operation timing of the digital converter 109. When displaying an E image, an image to be displayed is determined by the processing unit 122 and is output to the I/O unit 124.

Figure 2A:
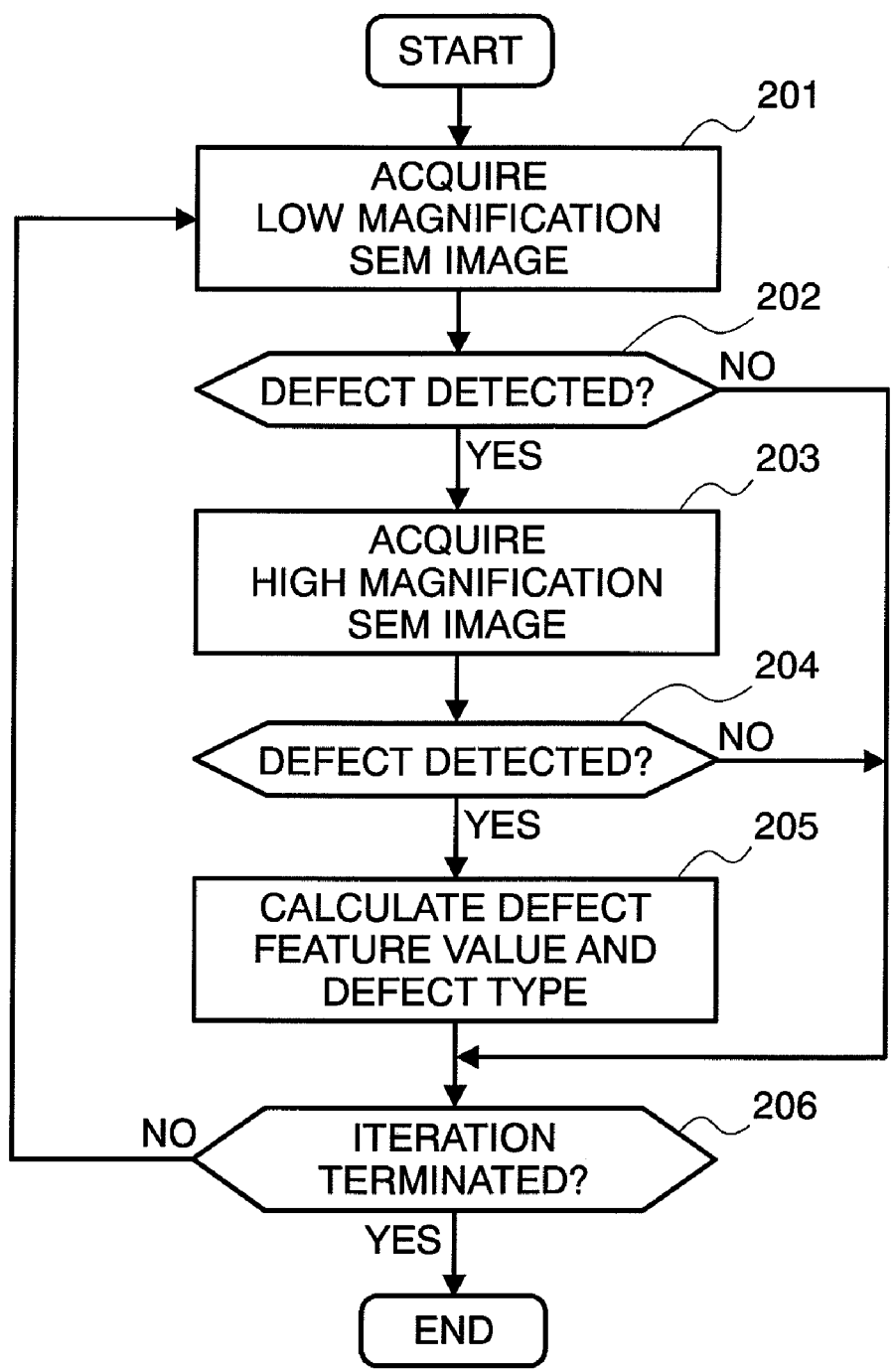
FIG. 2A shows a sequence (procedure) for automatic acquisition of a defect image in a review SEM, and is descriptive of an example case not including a step of imaging the defect with an optical microscope.
Figure 2B:
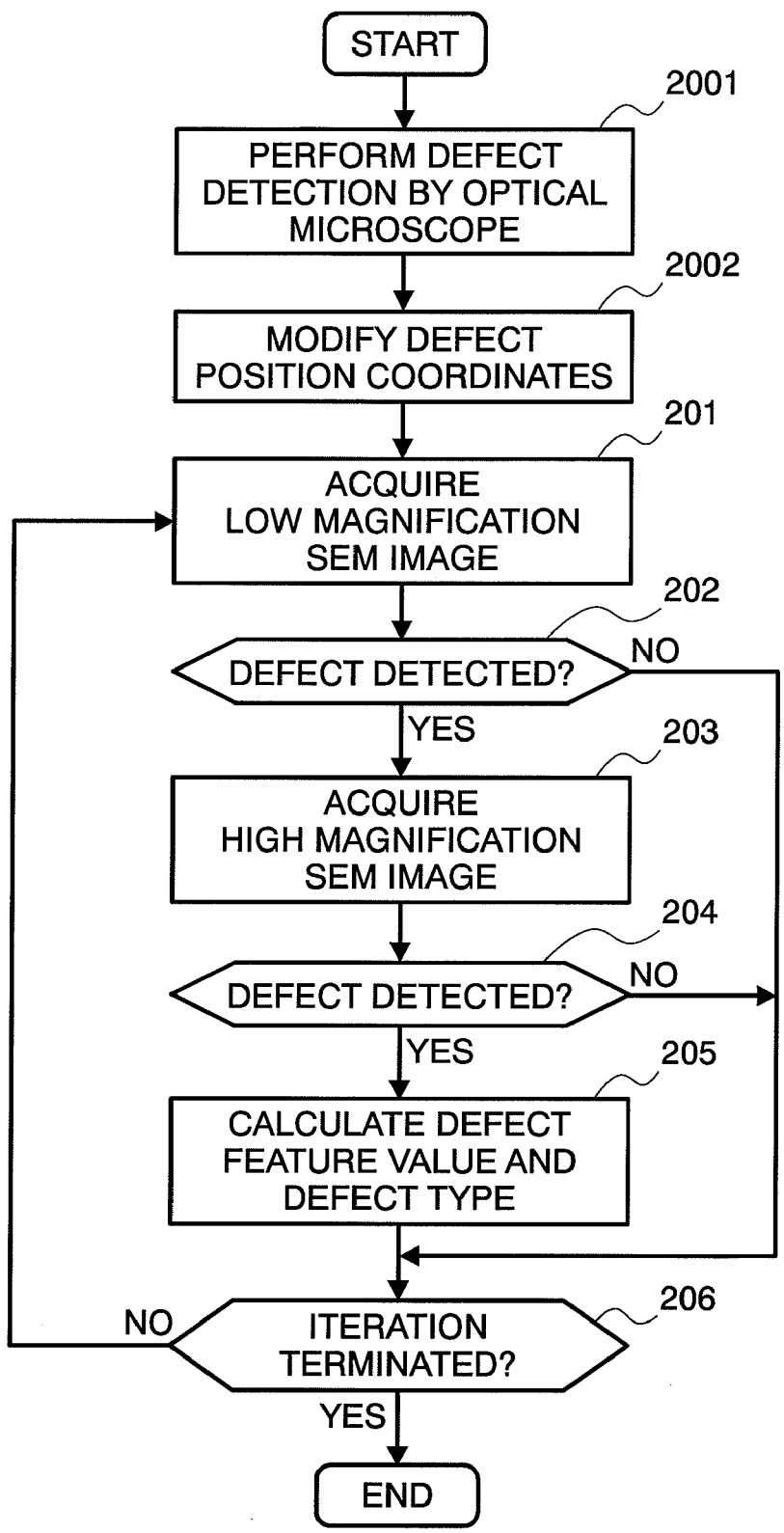
FIG. 2B shows a sequence (procedure) for automatic acquisition of a defect image in a review SEM, and is descriptive of an example case not including the step of imaging the defect with the optical microscope.

FIGS. 2A and 2B show FIG. 2A shows an imaging sequence (procedure) in the event of automatic acquisition of a defect image in the configuration of FIG. 1.

With reference to FIG. 2A, in step 201, imaging is performed with the SEM at a low magnification by using information of coordinates of a defect detected by a defect detector (not shown). Then, in step 202, the acquired low magnification SEM image is processed, and defect detection therefrom is carried out. At this step, if no defect has been detected, then steps 203 to 205 described below are not executed. Alternatively, if a defect has been detected after the low magnification image, then in step 203 a defect position on the low magnification image is identified, and high magnification SEM image is acquired. Then in step 204, the acquired high magnification image is processed, and defect detection therefrom is carried out.

Alternatively, if a defect has been detected, then in step 205 calculation of, for example, a defect feature value and defect type is carried out by using the acquired low magnification image or high magnification image. The defect feature value is calculated from the captured image, and includes, for example, geometrical feature values of the size, irregularity, and circularity, and a topological feature value representing, for example, whether a defect is present on a pattern or under a film. The defect types are, but not limited to, engrossed foreign matters, pattern defects, under-film defects, and small-size defects. Steps 201 to 205 described above are iteratively carried out for a respective object defect. In order to carry out the process in a reduced time, ordinarily step 205 of carrying out calculation of, for example, the defect feature value and defect type, is executed in parallel with steps from 211 to 204 in the next or later iteration.

A case can occur, the accuracy of the defect coordinate position output from the defect detector (not shown) is low, such that the optical microscope 131, which is included in the review SEM, is used to perform imaging processing with a relatively wider field of view than that of the SEM 101. In this case, an operation has to be carried out to convert the defect position coordinates, which has been output from the defect detector (not shown), to the coordinate system of the SEM 101. In this case, the sequence (procedure) shown in FIG. 2B is carried out. At the outset, in step 2001, imaging processing and detection of an defect are carried out through the optical microscope 131 included in the review SEM in accordance with the defect position coordinates output from the defect detector (not shown). Then in step 2002, in accordance with the position information of the detected defect, the operation is carried out to convert the defect position coordinates output from the defect detector (not shown) to the coordinate system of the review SEM.

Similarly to step 201 shown in FIG. 2A, low magnification imaging is carried out for the defect, of which the position coordinates have been converted to the coordinate system of the review SEM, FIG. 2A. Steps 201 to 206 of FIG. 2B are carried out in the same manner as that described in conjunction with FIG. 2A. On the other hand, if in step 2001 no defect has been detected, a different sequence (procedure) for detecting another defect output from the defect detector (not shown) can be added.

In order for a user to verify a feature of a defect and to perform analysis of the defect, a function is necessary to display an image of the defect acquired by being imaged by the SEM 101 onto, for example, a screen or paper sheet. The user is permitted to use the screen, which is provided to display a defect image acquired by being acquired by the SEM 101 imaged, to carry out various processes. The processes are, for example, manual classification of defects, correction of an automatically classified defect type, specification of an imaging condition, adjustment of a parameter used for image processing, and specifying a defect display method. As such, it is important to provide a display method enabling efficiently displaying of useful information for smooth execution of these processes. An embodiment of a display method enabling efficiently displaying of useful information will be described herebelow.

Figure 3:
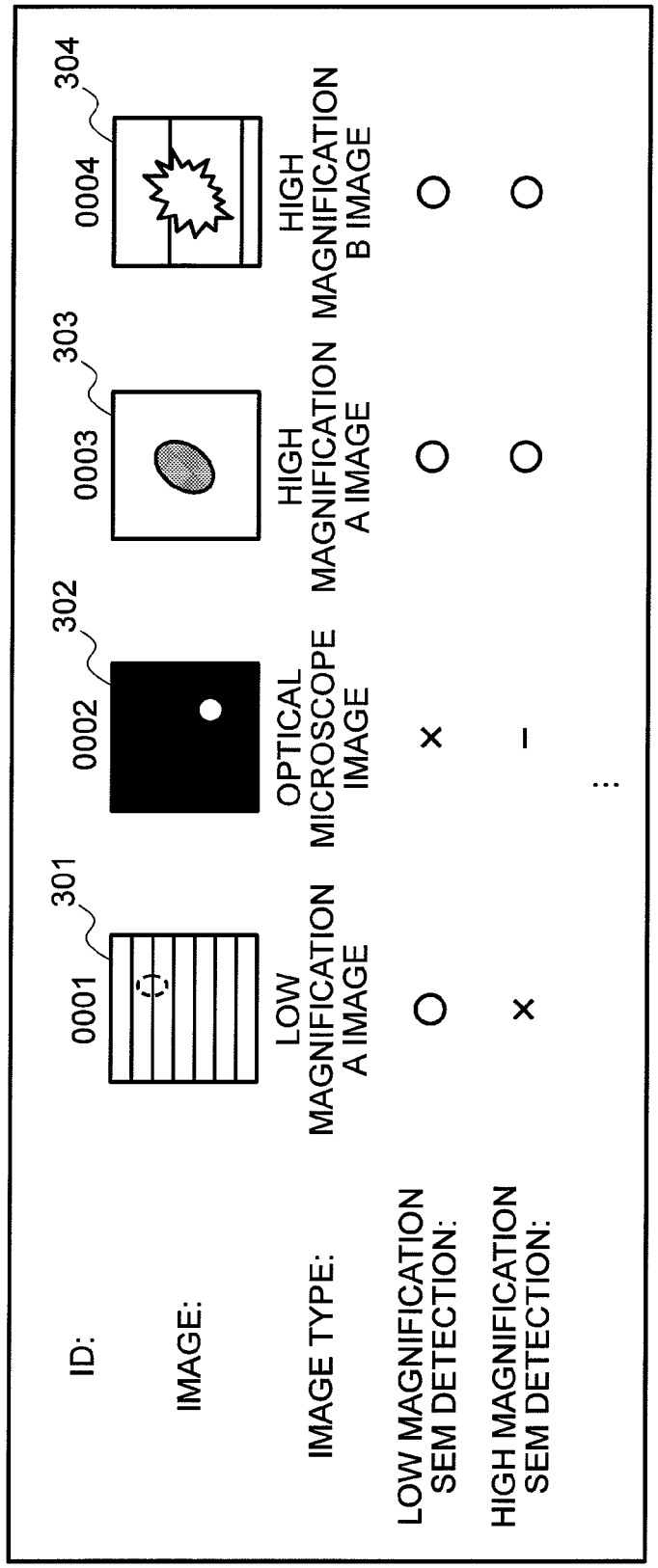
FIG. 3 shows one embodiment of a thumbnail display screen of defect images.

FIG. 3 is a view showing one embodiment of a thumbnail display mode that displays thumbnail images in units of a respective defect imaged through the SEM 101 in accordance with the sequence (procedure) shown in FIG. 2A or 2B. One image as per a respective defect is displayed to make it possible for a user to quickly and easily obtain useful features of a respective defect from a respective thumbnail display screen. Concurrently, the display image is determined in units of a defect to make it possible to display an image clearly indicative of the features of the defect in accordance with the defect information. A criterion for determination of an image clearly indicative of features of a defect can be considered to be derived from a condition that, for example, the defect on the image is automatically detectable, is high in contrast, and is imaged in a large size.

A respective image to be displayed from defect information can be determined totally automatically implemented in accordance with a preliminarily built-in determination algorithm, or can be partly or totally specified by the user. The defect information to be used can be one of or a combination of some items of, for example, inspection information to be output from an inspection apparatus other than the review SEM, information indicative of whether defect detection has been accomplishable, defect feature value, and defect type.

An example shown in FIG. 3 shows the following. In a defect 301, an optical microscope image is displayed since the defect has been detectable on a high magnification SEM image, but has not been detectable on a low magnification SEM image. In a defect 302, an optical microscope image is displayed since the defect has not been detectable on a low magnification SEM image. In defects 303 and 304, while the respective defects have been detectable on a low magnification SEM image and a high magnification SEM image, the defects 303 and 304 are different from one another in defect type, such that the images being displayed are different from one another. More specifically, for example, the defect 303 is a pit-shaped defect having a sharp edge. Consequently, an edge portion detected and imaged by a secondary electron detector (corresponding to the detector 108 shown in FIG. 1, for example), which detects a large quantity of secondary electrons is highlighted and a high magnification image A having a high S/N ratio is displayed. On the other hand, the defect 304 is a defect of which irregularity is gentle. Consequently, there is displayed a high magnification image B including much gentle irregularity information of the sample and detected and acquired by a backscattered electron detector (corresponding to the detector 108' shown in FIG. 1, for example), which detects a large quantity of backscattered electrons.

For a display image to be displayed in the above manner, any one of, for example, an acquired image, an image formed by processing the acquired image, and a combined image of two or more acquired images can be used. Alternatively, for a display image, a graph of an X-ray spectrum acquired from an X-ray detector can be used for example. On the thumbnail display screen, for example, a defect ID, image type, inspection information, defect feature value, and defect type can be displayed. In the example shown in FIG. 3, while the defects are sorted by the defect ID, the defects can be sorted by any one of, for example, the image type, inspection information, defect feature value, and defect type.

FIG. 4 shows one embodiment of a thumbnail display mode that displays a small number of (or a multiple) thumbnail images in units of a respective defect imaged through the SEM 101 in accordance with the sequence (procedure) shown in FIG. 2A or 2B. The display mode such as shown in FIG. 4 is preferable for application to the case that, rather than the display mode such as shown in FIG. 3 for displaying the image in units of the respective one defect, the mode for displaying multiple images in units of a respective defect is better to enable the user to quickly and easily acquire useful features from the respective defect.

As a preferable case for the display mode such as shown in FIG. 4, an example case can be contemplated in which, for example, defect detection has been accomplishable since a potential contrast phenomenon has occurred in the defect during low magnification SEM imaging. In this case, two images are displayed in a side-by-side arrangement on the same thumbnail display screen. One image is a low magnification SEM image acquired in such a manner that imaging is performed without applying so a high bias voltage to the electrode 113 to thereby enable defect detection to easily be accomplished even at a low magnification so that the potential contrast is visible. The other image is a high magnification SEM image acquired by applying a high bias voltage to the electrode 113 to enable acquiring information of a pit bottom of a pit-shaped defect, thereby enabling review of the defect to easily be accomplished. Thereby, further useful information can be provided to the user with high efficiency, compared to the case where only one image is displayed.

As another preferable case for the display mode such as shown in FIG. 4, an example case can be contemplated in which EDX data is acquired, and a high magnification SEM image and an image representing EDX data are together output. When information so useful is not contained in a second one of the images, the display method may be such that an image containing useful information is distinguishable from an image not containing the useful information to reduce a burden on the user. The display method as described above can be realized in, for example, either a manner that a mark is put on the image or a manner that the degree of containment of the useful information is automatically calculated and displayed in the form of a graph. Further, in the case that features of a defect are sufficiently known from only one image being displayed, only one image is displayed.

The screens in the display mode, such as shown in each of FIGS. 3 and 4, are configured to permit the user to perform various operations described as follows. For example, the user can select an image indicative of a respective defect (i.e., defect image) and to correlate the selected display image to an appropriate defect type through, for example, drag-and-drop operations. In addition, the user can manually classify the defect type of the image and to alter or correct the defect type automatically classified. Further, by reflection of the results derived from respective parameters in image processes into the respective display images, the user can adjust or re-specify the respective parameter while seeing the images.

Figure 5:
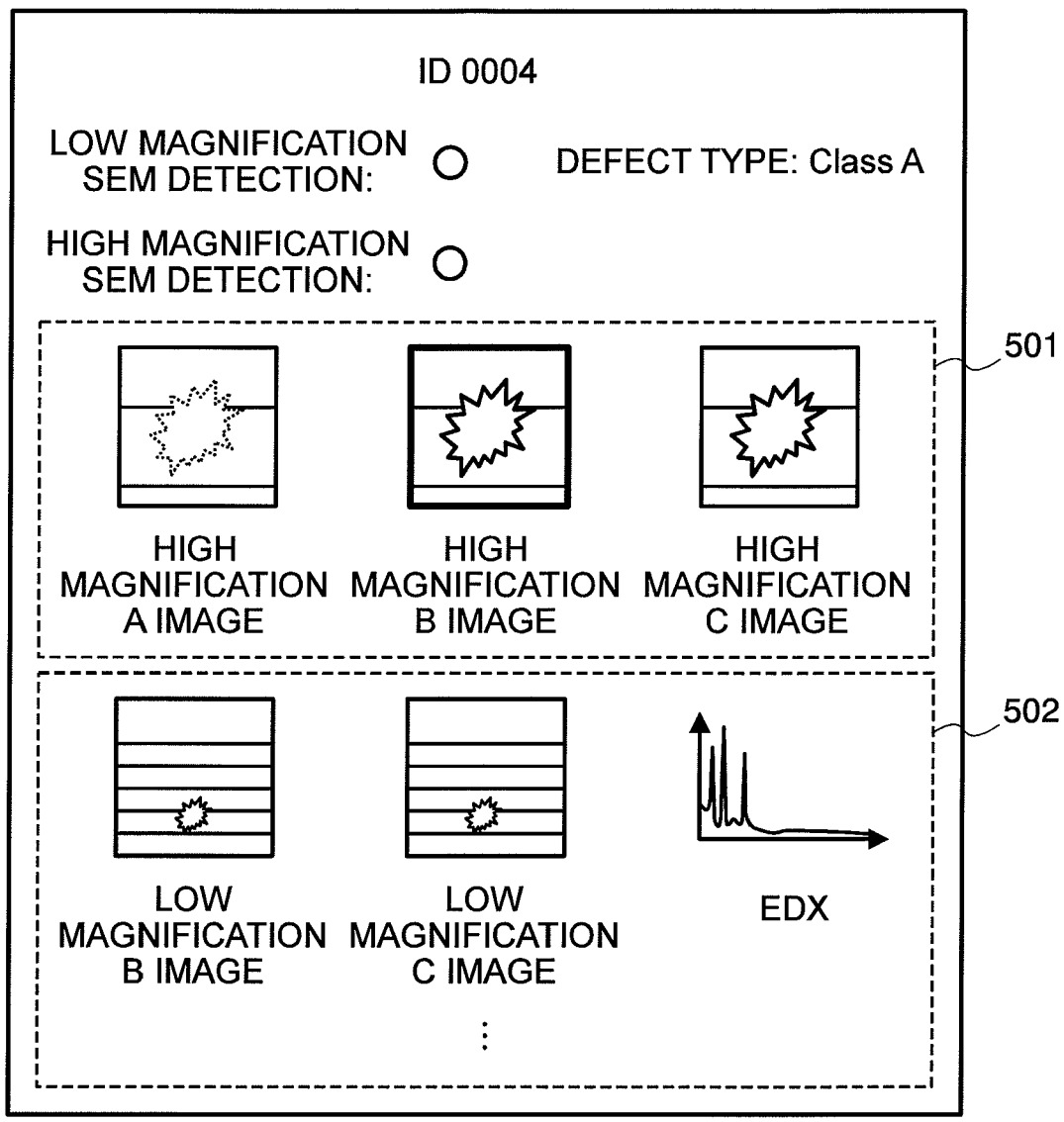
FIG. 5 shows one embodiment of a detail display screen of defect images.

FIG. 5 shows one embodiment of a display mode for performing detail display of images acquired in accordance with the sequence (procedure) shown in FIG. 2A or 2B. In the embodiment, a part or all of images taken of a respective defect are displayed to thereby provide detail information. The image types of display images and the display sequence thereof are determined in accordance with defect information. Displayable image candidates are the same as in the thumbnail display mode. On the detail display screen, for example, a defect ID, image type, inspection information, defect feature value, and defect type can be displayed. A display region of defect images includes regions 501 and 502. For the region 501, the defect display sequence is fixed in units of the defect (the region hereinbelow will be referred to as a "fixed display region"); and for the region 502, the defect display sequence is variable in units of the defect (the region hereinbelow will be referred to as a "variable display region").

Figure 6A:
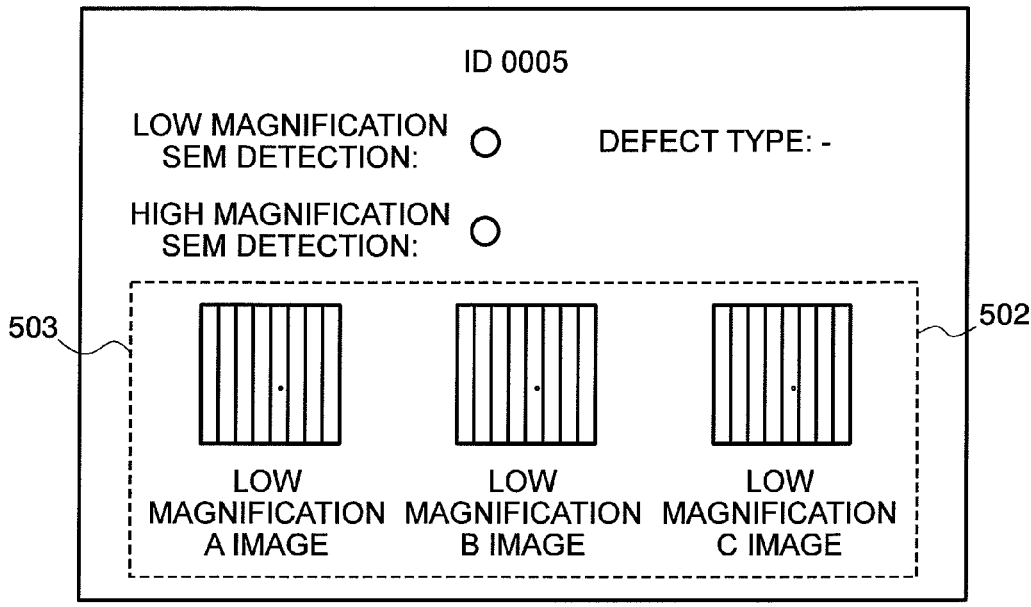
FIG. 6A shows one embodiment of a detail display screen in a state where a fixed display region is removed, but only a variable display region is displayed.

The display method can be such that a region of the detail display screen for the fixed display region 501 or the variable display region 502 is specifiable by the user. In addition, a case can occur in which an image for displaying in the fixed display region 501 cannot be acquired since no image has been detectable in step 202 shown in FIG. 2. In this case, a case can take place in which, as in an embodiment shown in FIG. 6A, the fixed display region 501 is omitted, and the image is displayed only in the variable display region 502, thereby to make it possible to more easily acquire features of the defect. Thus, preferably, the presence or absence of the fixed display region 501 is variable in units of defect information. Of defect images, images to be displayed in the thumbnail display mode are highlighted with, for example, a frame 503 so as to be easily identifiable for thumbnail display.

Figure 6B:
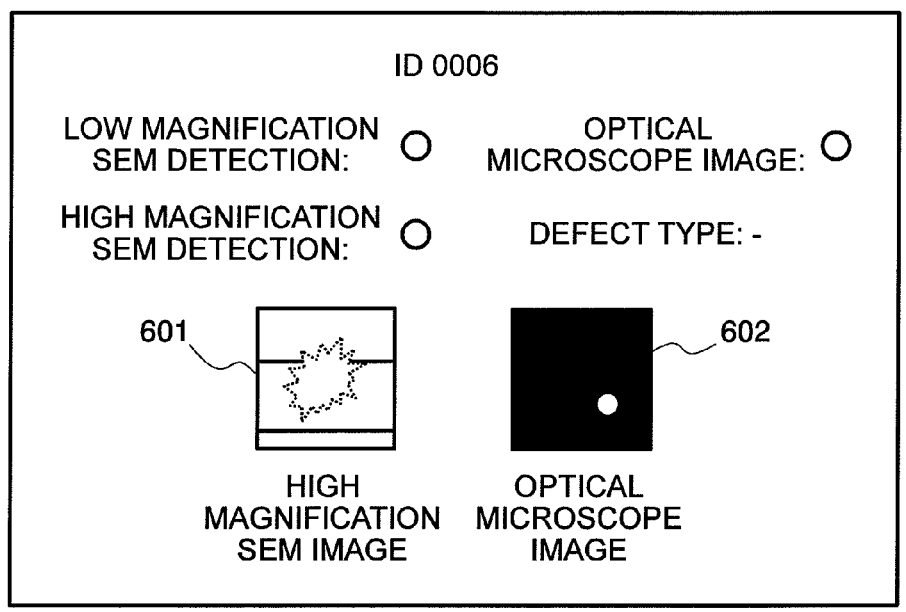
FIG. 6B shows one embodiment of a detail display screen of defect images, specifically, a high-magnification SEM image and optical system image displayed in a side-by-side arrangement.

Further, as shown in FIG. 6B, a case can take place in which, while a defect can be extracted from a high magnification SEM image 601, the contour shape thereof is unclear to the extent of making it difficult to extract a feature value of a defect image from the high magnification SEM image 601. In this case, the display mode may be such that an optical microscope image 602 is displayed side-by-side arrangement with the high magnification SEM image 601. With the display thus arranged, an operator is able to determine, for example, the type and position (intra-film position, under-film position, or on-film-surface position) of the defect while seeing the display screen.

Figure 7:
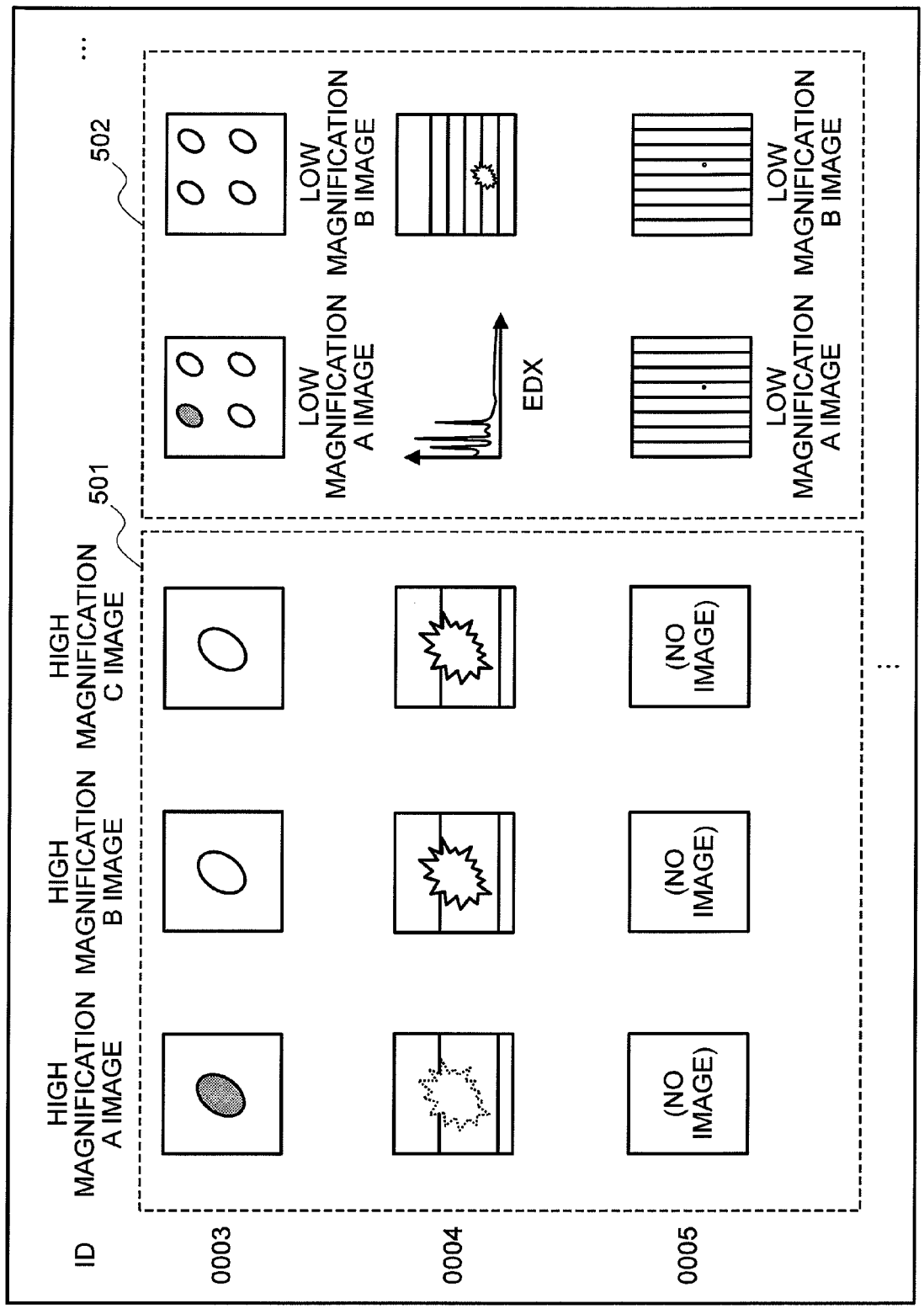
FIG. 7 shows one embodiment of a display screen of defect images.

As above, the respective embodiments of the thumbnail and detail display modes (and screens) have been described with reference to FIGS. 3 to 6. However, according to an example of the present invention, the thumbnail and detail display modes can be implemented as a combined display mode at the same time on, for example, one screen. Alternatively, two or more screens can be used to thereby carry out one or both of the thumbnail and detail display modes. Further, the present invention is adaptable even in the event of outputting of images onto, for example, other devices and mediums than displays, such as in the event of printing of images onto mediums, such as paper sheets or films. In this case, another embodiment as shown in FIG. 7 can be implemented, in addition to the display modes as shown in FIGS. 3 to 6. In the embodiment, multiple images different in image type from one another and indicative of respective defects different in ID from one another are displayed in a region 501 of a screen. Concurrently, for example, on the screen, multiple defects are displayed in one image region as in an example of a region 502 of the screen, and information indicative of defect features, such as EDX data, are displayed.

Figure 8:
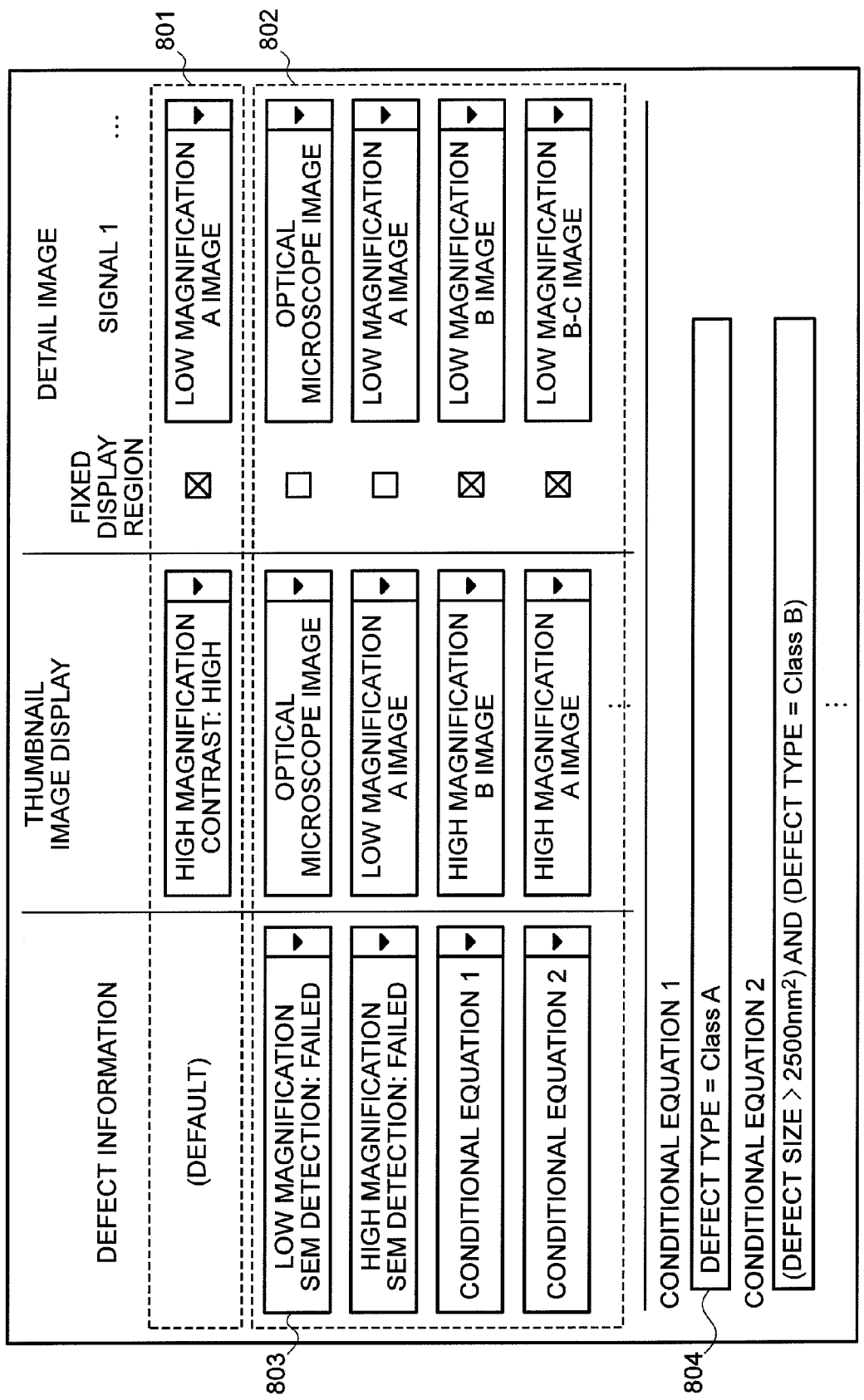
FIG. 8 shows one embodiment of a setup screen for specifying a display image in units of a defect.

FIG. 8 shows one embodiment of a setup screen for setting user specifications relevant to display images in the thumbnail display mode shown in FIG. 3 and the detail display modes shown in FIGS. 5 and 6. In the present embodiment, the setup screen is segmented into a default setup region 801 for a display image and a non-default setup region 802 for the display image. The default setup region 801 is configured to enable correlation between defect information and the display image. The non-default setup region 802 includes a field 803 for specification of defect information. In the field 803, there should be able to enter a specification uniquely recognizable whether a setup item is applicable to an arbitrary defect.

Since a description for defect information specification can be lengthy, a separate field such as a field 804 can be prepared. The specification method can be preliminarily defined such as described in the following for making practical determination of which specification is applied, as follows. For example, when specifications applicable to the defect information in non-default specification, one of the applicable specifications which exists in the uppermost portion is applied, but otherwise (if no applicable specifications exist) a default specification is applied. However, any alternative specification method can be employed inasmuch as it enables the unique determination to be made which one of specifications is applied corresponding to each defect. For the specification of a display image, the type and display sequence of the display image is specifiable. The specification method can use an image type and a rule capable of identifying the image type. Since the gases of an image to be acquired in a respective condition, the display device can be such that an image to be not acquired is not specifiable.

Further, it can be specified whether to provide a fixed display region of a detail display screen, such as described in conjunction with FIGS. 5 and 6. In addition the setup screen shown and described in the present embodiment, separate setup screens can be provided for the respective thumbnail and detail display modes, and separate setup screen can be provided for the respective cases of output to the display and printing to a paper sheet. Further, in order to prevent the user as much as possible from entering burdensome or complicate specifications for the user, the embodiment can additionally include a function of automatically setting standard specifications and a function of storing and reading specifications to enable a quick shift of some specifications.

A review SEM including a function of acquiring, by necessity, an image for being displayed on a defect image display screen will be described herebelow. Preferably, a display image is displayable in such a case where a defect image desired to be displayed is not acquired when the processing has reached step 206 in the imaging sequence (procedure) shown in FIG. 2 or where re-imaging is desired to be performed by using an altered imaging condition to acquired an image more clearly indicating the features. In this case, imaging processing can be accomplished without introducing a significant reduction in the overall throughput.

Figure 9:
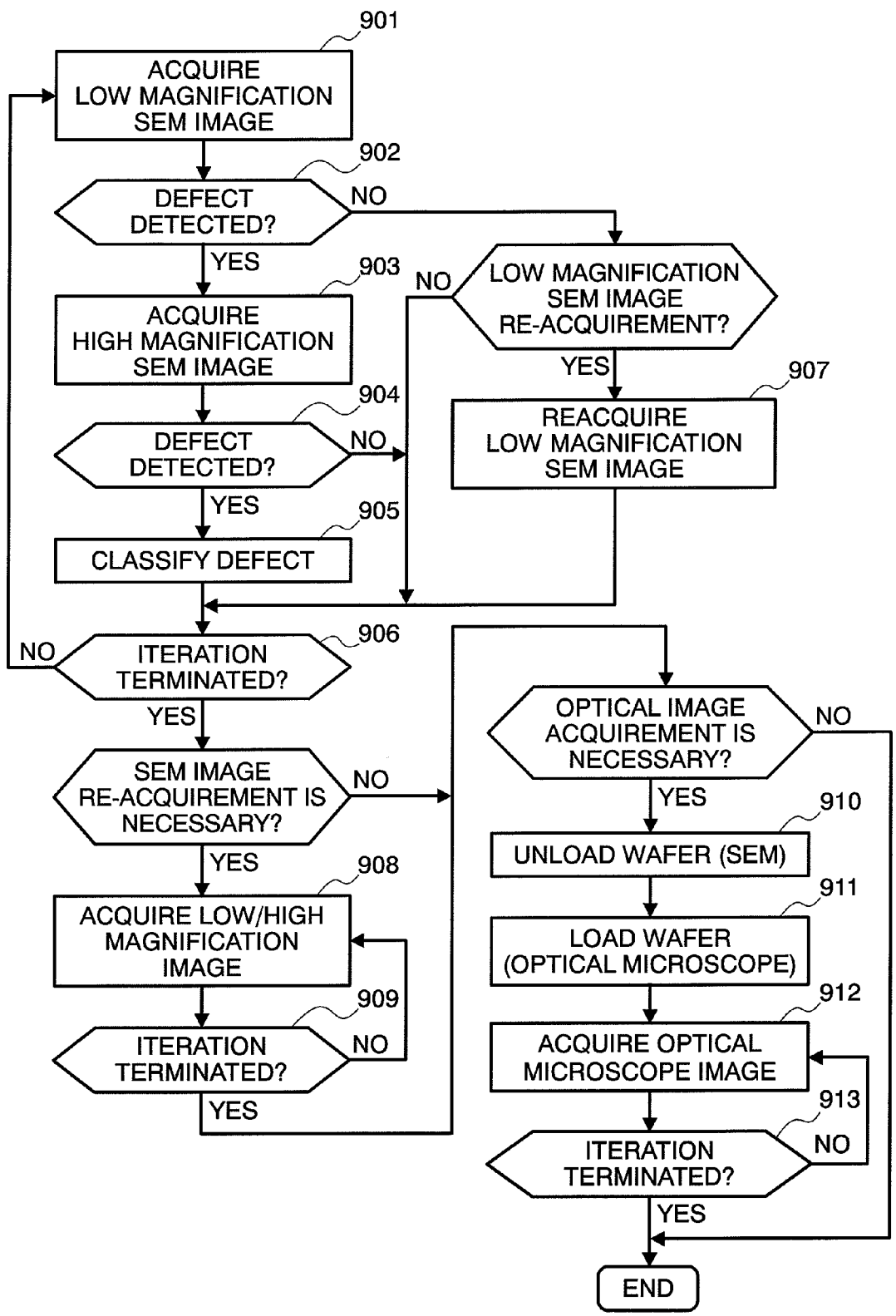
FIG. 9 is a sequence (procedure) for later acquiring a display image by necessity, in accordance with an example of the present invention.

FIG. 9 is an imaging sequence (procedure) including an added step of later imaging a display image. Steps 901 to 906 are identical to steps 201 to 206 shown in FIG. 2A. One sequence (procedure) different from the sequence (procedure) shown in FIG. 2A is for performing a re-imaging processing for acquiring a low magnification image in step 907. The re-imaging processing is performed in the event that no defect has been detected from a low magnification image in step 902, and in that event, it is preliminarily specified to reacquire a low magnification image of the defect by using an altered condition. However, for execution of the re-imaging processing in step 907 in the event that no detect has been detectable from the low magnification image in step 902, it is necessary for the sequence (procedure) to be able to shift to step 907 without taking time for, for example, alteration to the imaging condition necessary for the execution of the re-imaging processing. Conversely, in the case that since it takes time for, for example, alteration to the imaging condition in the event of the re-imaging processing, it is more efficient to collectively image only defects necessary to be later re-imaged, the re-imaging processing is not performed in step 907, but is performed in step 908 that is executed later than step 906.

Another sequence (procedure) different from the sequence (procedure) shown in FIG. 2A is for imaging a defect after termination of imaging of an object defect of step 906. The defect in this case is, for example, a defect necessary to be re-imaged at a high magnification of the SEM or a defect necessary to be re-imaged by the optical microscope. Imaging processing of the defect is performed to prevent a significant throughput reduction.

Although the applicability to a condition preliminarily specified for acquiring a high magnification SEM image will be known after step 905, ordinarily step 905 is carried out in parallel with steps 901 to 904, as described in conjunction with FIG. 2A. In this case, since the sample in process is already moved to the process of imaging another defect, it is more efficient to execute the re-imaging processing for acquiring the high magnification SEM images after step 906.

For the reason described above, in the embodiment shown in FIG. 9, the re-imaging processing for acquiring high magnification SEM images of defects necessary to be re-imaged process is executed, if necessary, in steps 908 and 909. In addition, in this event, also re-imaging processing to acquire a low magnification SEM image is executed in the same step 908, if necessary.

When it is necessary to perform imaging processing, it takes time for preparation work, such as movement of the sample to the optical microscope before the execution of imaging processing, such that it is more efficient to execute the imaging processing after termination of SEM imaging processing. In this case, in step 910 a wafer is unloaded from the SEM, in step 911 the wafer is loaded into the optical microscope, and steps 912 and 913 an iterative imaging processing is executed for a defect necessary to be imaged by the optical microscope. Further, although not shown in FIG. 9, a sequence (procedure) can be provided for executing imaging processing of an inclined column or the like by using a different electron optical system. The present embodiment is, as described above, one example of the sequence (procedure) for acquiring display images. However, depending on, for example, the apparatus and operating environment, different sequence (procedure)s producing high throughput can be used. Further, the defect information can be updated by execution of, for example, classification into the defect type and image process after acquisition of display images.

Figure 10:
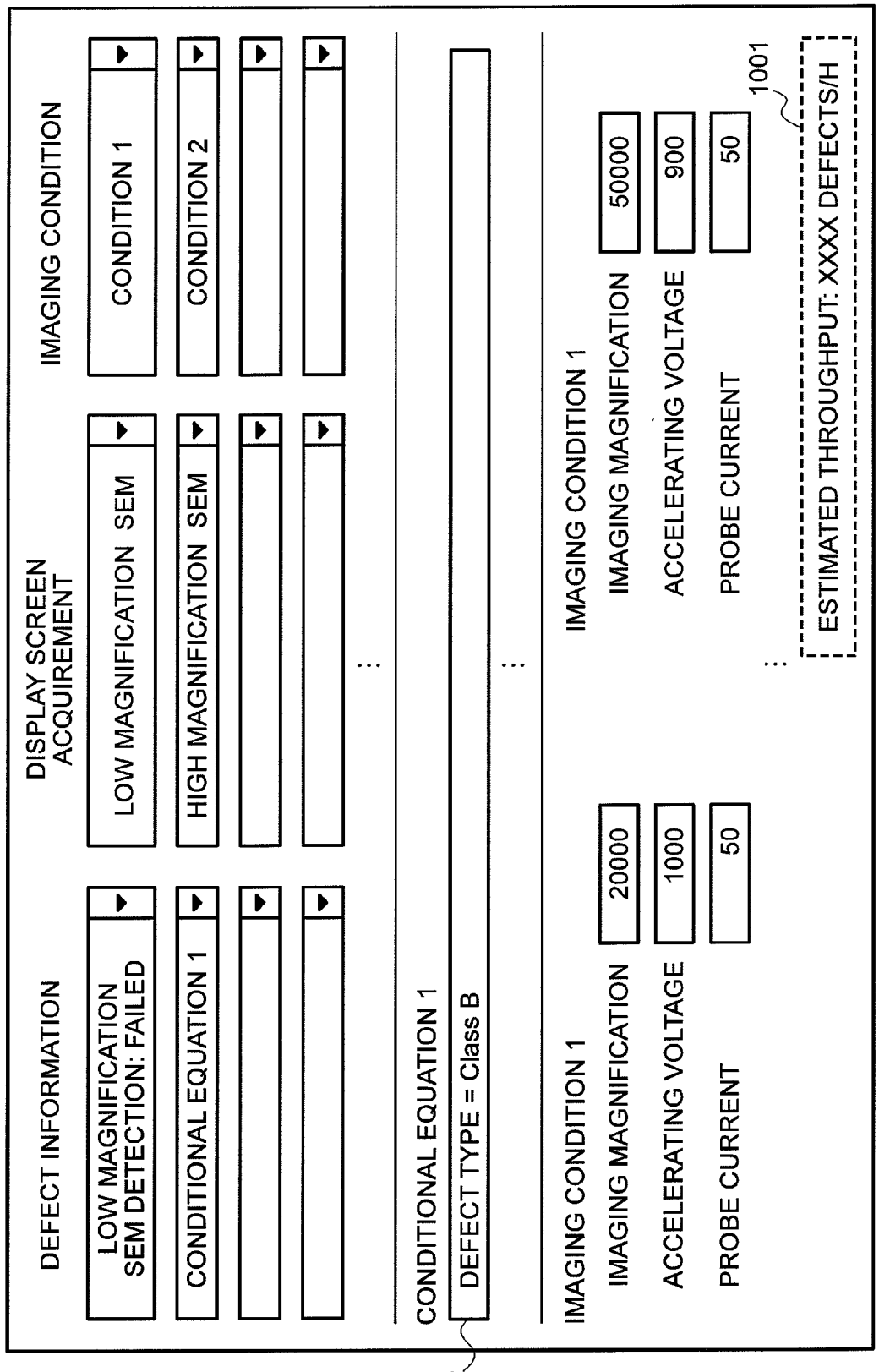
FIG. 10 is one embodiment of a setup screen for determining whether a display image is later acquired.

FIG. 10 is one embodiment of a setup screen for determining whether a display image is later acquired in an imaging sequence (procedure) such as shown in FIG. 9. In the present embodiment, a combination of defect information, which is necessary for later acquiring a respective display image, and an image to be acquired (acquisition image) is specifiable. According to the embodiment shown in FIG. 10, when no defect has been detectable through a low magnification SEM, a low magnification SEM image is acquired as a display image. Further, when the defect type is a class B, a high magnification SEM image is acquired as a display image. Imaging conditions for the imaging processing events are specifiable as well. Further, in the event of execution of re-imaging processing for acquiring the low magnification image, an interface can be provided for specifying imaging processing timing that determines whether, for example, the re-imaging processing is executed in step 907 or 908 of the embodiment shown in FIG. 9.

In many cases, when determining whether a display image is later acquired, a user ordinarily takes into consideration a reduction amount of the overall throughput that can occur due to the imaging processing. As such, the setup screen displays a roughly estimated value of the overall throughput, such as shown in a field 1001. As a method of determination of an imaging sequence (procedure) from the embodiment shown in FIG. 10, a sequence (procedure) can be such that, for example, a respective defect is checked to learn which one of setup items is applicable thereto, in which if an applicable item exists, then imaging processing is carried out as specified for all the items; or if no item exists, then no display image is later acquired.

In the example imaging sequence (procedure) according to the present invention, a case can occur in which two images of the same type acquired by altering the condition are output. In such a case, in a setup screen for specifying display images, such as shown in FIG. 8, the images have to be identifiable from one another. Further, a case can take place in which, in a setup screen for specifying display images, such as shown in FIG. 8, images are limited to only those for which display-image selection options are acquirable by addition of the sequence (procedure) for later acquiring images. In such a case, the display image selection options have to be limited also by consideration of images acquirable by later execution of imaging processing. The type of the acquirable image can be determined from the contents specified in the present embodiment shown in FIG. 10, such that the images can be limited to those for which display-image selection options are acquirable.

The setup screen shown and described in the present embodiment is one embodiment, as described above. As such, any different setup screen may be used inasmuch as it enables the unique determination of the type of the image that is later acquired as the display image for all items of defect information. Further, in the present embodiment shown in FIGS. 8 and 10, two separate setup screens, i.e., one regarding the image display and the other regarding the display images to be later acquired, are provided. However, a setup screen enabling the specifications to be together carried out can be used.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:
1. A method for displaying defect images, comprising the steps of:
    acquiring a plurality of per-defect images of respective ones of a plurality of defects by performing imaging processing under respective ones of a plurality of conditions in accordance with position information of the respective ones of the plurality of defects detected on a sample by inspection preliminarily performed using an inspection apparatus;

extracting images indicative of the respective defects to be displayed corresponding to the respective defects from the plurality of per-defect images acquired on the plurality of defects; and displaying the extracted per-defect images in a side-by-side arrangement on a screen together with information of types of the respective images, wherein the extracted per-defect images include images with types that are different from each other.

2. A method for displaying defect images, as claimed in claim 1, wherein the extracted per-defect images indicative of features of the respective defects are extracted by using defect information.

3. A method for displaying defect images, as claimed in claim 1, wherein the information of the types of the respective images for being displayed in the side-by-side arrangement on the screen together with the extracted per-defect images includes any of an optical system image, low magnification SEM (scanning electron microscope) image, and high magnification SEM image.

4. A method for displaying defect images, as claimed in claim 1, wherein the images extracted for being displayed are a plurality of per-defect images, and the extracted plurality of per-defect images are displayed on the screen in a side-by-side arrangement together with information of types of the images.

5. A method for displaying defect images, as claimed in claim 2, wherein of the plurality of per-defect images, the defect information is either feature values or defect types.

6. A method for displaying defect images, as claimed in claim 5, wherein the extracted per-defect images indicative of features of the respective defects are extracted corresponding to the respective defects in accordance with either feature values or defect types of the plurality of per-defect images.

7. A method for displaying defect images, as claimed in claim 1, wherein the extracted per-defect images indicative of features of the respective defects are extracted in accordance with specification from a user.

8. A method for displaying defect images, as claimed in claim 4, wherein a defect sequence of the extracted plurality of per-defect images is determined in accordance with the defect information.

* * * * *